United States Patent
Shrivastava et al.

(10) Patent No.: US 10,211,200 B2
(45) Date of Patent: Feb. 19, 2019

(54) LOW TRIGGER AND HOLDING VOLTAGE SILICON CONTROLLED RECTIFIER (SCR) FOR NON-PLANAR TECHNOLOGIES

(71) Applicant: INDIAN INSTITUTE OF SCIENCE, Bangalore (IN)

(72) Inventors: Mayank Shrivastava, Bangalore (IN); Milova Paul, Bangalore (IN); Christian Russ, Diedorf (DE); Harald Gossner, Riemerling (DE)

(73) Assignee: INDIAN INSTITUTE OF SCIENCE, Bangalore (IN)

( * ) Notice: Subject to any disclaimer, the term of this patent is extended or adjusted under 35 U.S.C. 154(b) by 0 days.

(21) Appl. No.: 15/883,591

(22) Filed: Jan. 30, 2018

(65) Prior Publication Data
US 2018/0219007 A1    Aug. 2, 2018

(30) Foreign Application Priority Data
Feb. 1, 2017  (IN) .............................. 201741003772

(51) Int. Cl.
*H01L 27/02* (2006.01)
*H01L 29/74* (2006.01)
*H01L 29/78* (2006.01)

(52) U.S. Cl.
CPC ...... *H01L 27/0262* (2013.01); *H01L 27/0296* (2013.01); *H01L 29/742* (2013.01); *H01L 29/7436* (2013.01); *H01L 29/785* (2013.01)

(58) Field of Classification Search
CPC ............. H01L 27/0262; H01L 27/0296; H01L 29/742; H01L 29/7436; H01L 29/785
See application file for complete search history.

(56) References Cited

U.S. PATENT DOCUMENTS

| | | |
|---|---|---|
| 6,909,149 B2 | 6/2005 | Russ et al. |
| 7,135,745 B1 | 11/2006 | Horch et al. |
| 7,414,273 B2 * | 8/2008 | Mohn ................. H01L 27/0262 257/122 |
| 7,638,370 B2 | 12/2009 | Gossner et al. |
| 7,943,438 B2 | 5/2011 | Gauthier, Jr. et al. |
| 8,455,947 B2 | 6/2013 | Shrivastava et al. |
| 8,963,201 B2 | 2/2015 | Shrivastava et al. |
| 9,236,374 B2 | 1/2016 | Campi, Jr. et al. |
| 9,240,471 B2 | 1/2016 | Di Sarro et al. |

(Continued)

*Primary Examiner* — Earl Taylor
(74) *Attorney, Agent, or Firm* — Oliff PLC

(57) ABSTRACT

The present disclosure relates to a Silicon Controlled Rectifier (SCR) in non-planar technology to provide a robust ESD protection in System on Chip employing non-planar technologies. The disclosed SCR incorporates wire or fin shaped nanostructures extending from p-type tap to cathode, from the cathode to anode, and from the anode to n-type tap to provide parallel trigger paths to prevent problem of current crowding at the base emitter junction that limits efficient turn-on in conventional SCRs. The proposed structure helps in offering lower trigger and holding voltage, and therefore very high failure currents. The disclosed SCR has sub-3V trigger and holding voltage to provide an efficient and robust ESD protection in SOCs. The proposed device also offers three times better ESD robustness per unit area. Further the proposed SCR has no added capacitive loading and is compatible with standard process flow and design rules.

17 Claims, 12 Drawing Sheets

(56) References Cited

U.S. PATENT DOCUMENTS

| | | |
|---|---|---|
| 2004/0207021 A1 | 10/2004 | Russ et al. |
| 2005/0212051 A1 | 9/2005 | Jozwiak et al. |
| 2009/0278204 A1* | 11/2009 | Morino ............ H01L 21/823892 257/356 |
| 2013/0228824 A1* | 9/2013 | Morishita ............... H01L 29/74 257/173 |
| 2014/0097465 A1 | 4/2014 | Shrivastava et al. |
| 2014/0268451 A1* | 9/2014 | Van Wijmeersch ........................ H01L 27/0262 361/56 |
| 2018/0219007 A1* | 8/2018 | Shrivastava ........ H01L 27/0262 |
| 2018/0226317 A1* | 8/2018 | Shrivastava .......... H01L 23/367 |
| 2018/0247929 A1* | 8/2018 | Shrivastava ........ H01L 27/0266 |
| 2018/0248025 A1* | 8/2018 | Shrivastava .......... H01L 29/742 |

* cited by examiner

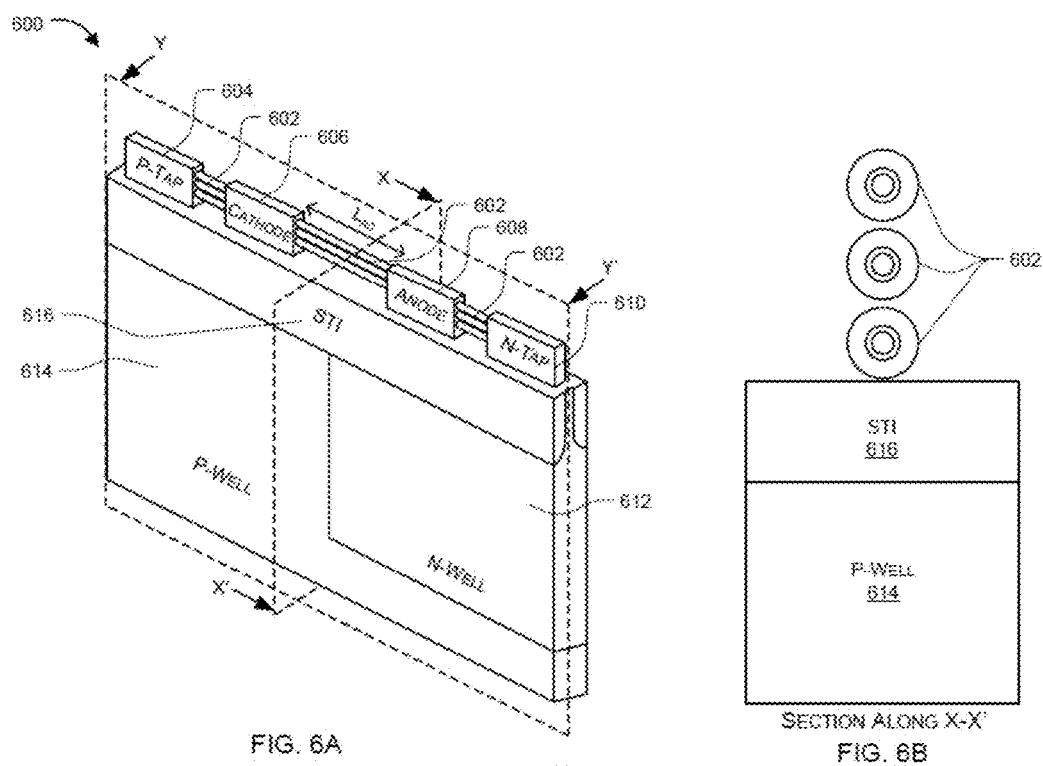
FIG. 6A
FIG. 6B
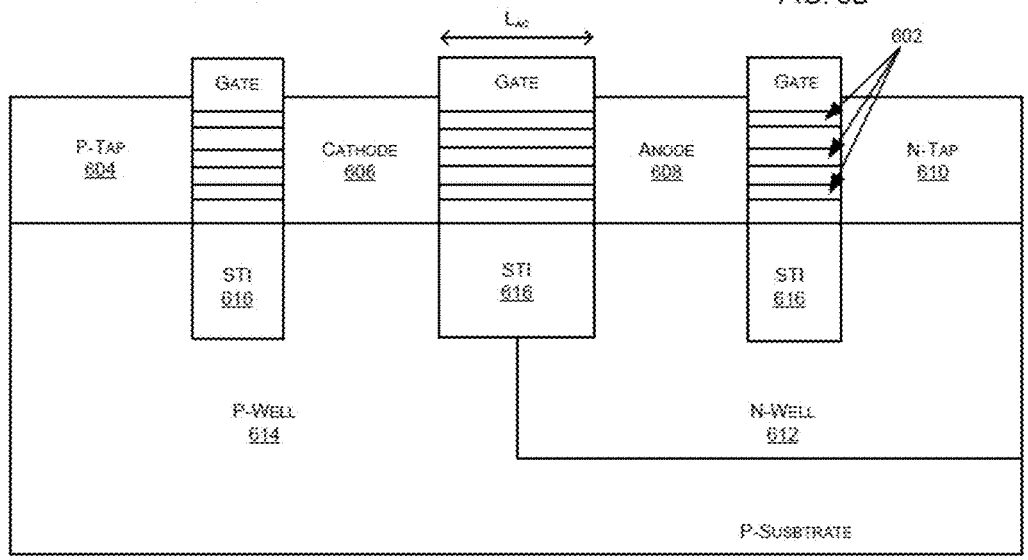
FIG. 6C

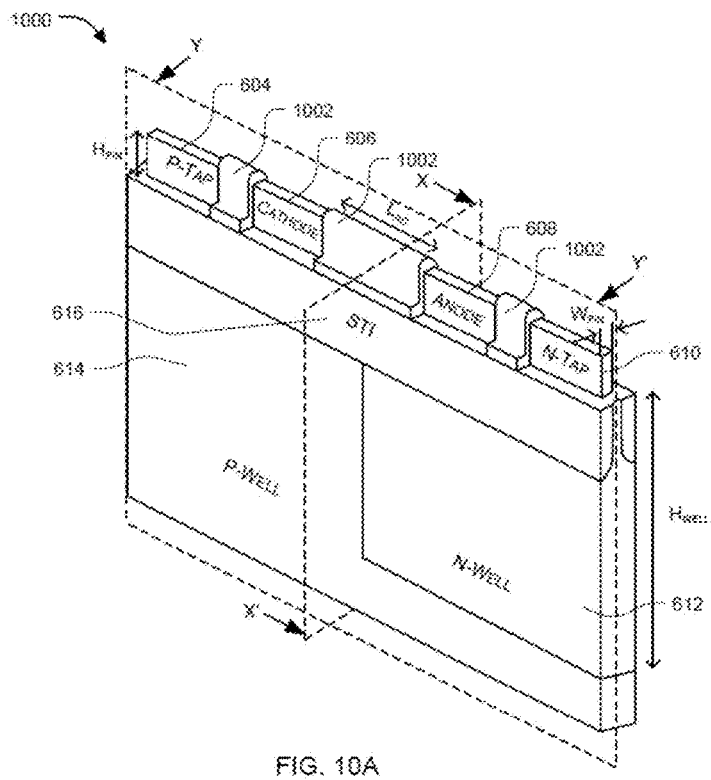
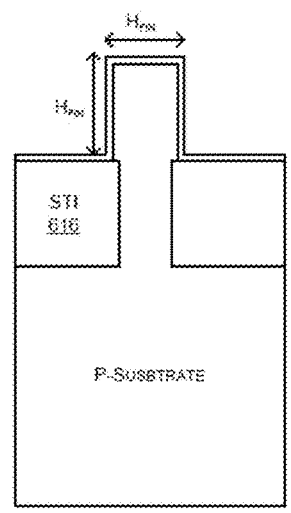
FIG. 10A  FIG. 10B
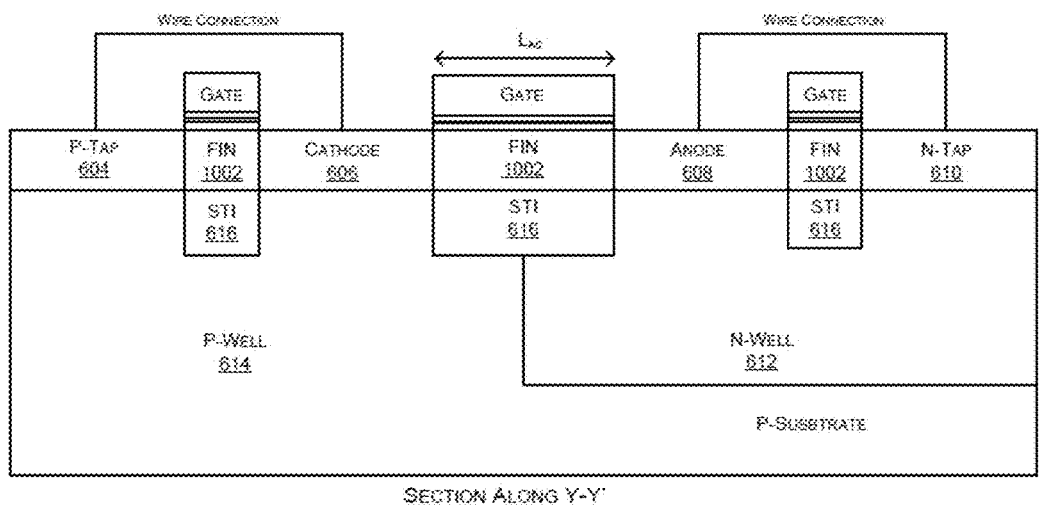
FIG. 10C

LOW TRIGGER AND HOLDING VOLTAGE SILICON CONTROLLED RECTIFIER (SCR) FOR NON-PLANAR TECHNOLOGIES

TECHNICAL FIELD

The present disclosure relates generally to the field of System on Chip (SoC). In particular it pertains to an ESD protection device and corresponding circuit for Systems on Chip in non-planar technologies.

BACKGROUND

Background description includes information that may be useful in understanding the present invention. It is not an admission that any of the information provided herein is prior art or relevant to the presently claimed invention, or that any publication specifically or implicitly referenced is prior art.

With planar bulk Metal-Oxide Semiconductor (MOS) devices reaching their scaling limits, non-planar technologies have provided new and efficient ways to replace their planar counterparts. They offer beneficial technological solutions to scale the conventional transistors. FinFETs, Trigate, and similar non-planar devices have become popular for use in technologies for sub-14 nm gate lengths. These technologies are found to be promising for System on Chip (SoC) applications that need reduced system cost, size, and power while enjoying improved system performance.

However, this came with a price of lowered Electrostatic Discharge (ESD) robustness in these advanced technology nodes. A SoC chip in advance CMOS consists of various analog, RF and digital functional blocks, each requires dedicated ESD protection. Electrostatic Discharge is a random event, which leads to massive flow of current (in amperes) between bodies having different electrostatic potential for sub-500 ns duration. Such a high current injection can cause severe device damage by gate oxide breakdown or meltdown of device active area. Hence, it is of crucial importance to design effective ESD protection solutions in non-planar technology nodes.

There have been extensive investigations on designing several protection concepts like Diodes, Bipolar Junction Transistors (BJTs), Metal-oxide-semiconductor field effect transistors (MOSFETs) and Silicon Controlled Rectifier (SCR) in FinFET technology during the last ten years. Out of these, SCRs are suited for ESD protection in low voltage-high speed I/O as well as for ESD protection of RF pads due to least parasitic loading and smallest foot print offered by SCRs.

However, conventional SCRs shown in FIG. 1 suffer from very high turn-on and holding voltage, and the drawback becomes even more severe in non-planar technologies and cannot be handled by conventional approaches such as diode or transient turn-on techniques. Furthermore, conventional planar SCR design of FIG. 1 cannot be directly deployed to non-planar technologies due to technological limitations. Conventional SCRs also have poor bipolar efficiency and demonstrate weak regenerative feedback mechanism.

FIG. 2 shows (a) top view and (b) cross sectional view of a conventional SCR device (P-N-P-N) for FinFET or planar Silicon-in-Insulator (SOI) technology. Disadvantage of the SCR device of FIG. 2 is that it does not provide options for tuning its trigger or holding voltage and suffers from high on-resistance.

FIG. 3 shows a conventional gated SCR device for planar SOI technology, which can be also used for emerging technologies like FinFET. However, it suffers from disadvantage that it provides weak controllability over its turn-on voltage, and has no control over holding voltage and suffers from high on-resistance.

There are many other prior art references that provide different ways of implementing an existing SCR-like devices in planar SOI and FinFET technologies. However, such devices do not provide robust tuning capability or low trigger/holding voltage. For example, U.S. Patent application US2004/0207021A1, U.S. Pat. No. 6,909,149 B2, and U.S. patent application US2005/0212051 A1 disclose an SCR with N and P trigger taps for injecting trigger current (for tuning trigger/holding voltage) in planar SOI technology.

U.S. Pat. No. 7,943,438B2 discloses another SCR invention with N and P taps in a different scheme in order to control holding/trigger voltage in planar SOI technology.

U.S. Pat. No. 7,638,370B2 and U.S. Pat. No. 8,455,947B2 disclose techniques that may be utilized to couple a first device portion and a second device portion for use in ESD protection in FinFET technology.

U.S. Pat. No. 9,240,471B2 and U.S. Pat. No. 9,236,374B2 disclose semiconductor structures having a plurality of fins on a substrate forming at least one electrostatic discharge (ESD) device spanning two or more of the plurality of fins.

U.S. Pat. No. 7,135,745B1, U.S. Pat. No. 8,963,201B2, and Patent application US2014/0097465A1 disclose additional SCR inventions in bulk FinFET technology. However they all suffer from above-mentioned disadvantages.

FIG. 4 shows Fin structures based on their planar counterparts known from the prior art references. Conventional FinFET SCRs are structurally made such that anode, cathode, n-tap and p-tap are individually realized inside a well by one or more Fins (as shown FIGS. 4d & 4e) in such a way that all 4 regions are aligned along one common fin direction (FIGS. 4b & 4c).

FIG. 5 shows (a) TLP I-V characteristics and, (b) transient anode voltage vs. time characteristics of conventional bulk FinFET SCR designs as realized by simulation using 3D TCAD. The simulation results depict very high holding voltage of 6.5V. Moreover, existing SCR devices suffer from lower failure thresholds due to very high current crowding and self-heating in the Fin regions, which significantly degrades the BJT action required for SCR to trigger. FIG. 5 further shows very high turn-on voltage and absence of snapback, which depicts that conventional FinFET SCR designs have missing SCR action and, therefore, cannot be adapted for low voltage ESD protection concepts attributed to fundamental limitations of tunability within the ESD design window.

There is therefore a need in the art for a SCR design for non-planar technologies with tunable trigger and holding voltage for efficient and robust ESD protection. There is further a need for a SCR design device that has better ESD robustness per unit area.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

In some embodiments, numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description used in the appended claims.

OBJECTS OF THE DISCLOSURE

A general object of the present disclosure is to provide a robust ESD protection in Metal-Oxide Semiconductor (MOS) devices in non-planar technologies.

An object of the present disclosure is to provide ESD protection in low voltage-high speed I/O as well as for RF pads in System on Chip (SoC).

An object of the present disclosure is to provide a Silicon Controlled Rectifier (SCR) in FinFET technology to meet ESD protection requirements in SoC employing non-planar technologies.

Another object of the present disclosure is to provide a SCR in non-planar technology that overcomes drawbacks of conventional SCRs.

Another object of the present disclosure is to provide a SCR in non-planar technology that provides control over its turn-on voltage and holding voltage.

Another object of the present disclosure is to provide a SCR in non-planar technology that incorporates feature of tunable trigger and holding voltage for exercising control over its turn-on voltage and holding voltage for an efficient and robust ESD protection.

Another object of the present disclosure is to provide a SCR design that provides low trigger and holding voltage for robust ESD protection.

Yet another object of the present disclosure is to provide a SCR design in non-planar technology that has low on-resistance.

Yet another object of the present disclosure is to provide a SCR design in non-planar technologies that provides better ESD robustness per unit area.

Still another object of the present disclosure is to provide an ESD protection circuit in non-planar SOCs that employs a non-planar SCR and overcomes limitations of conventional schemes for ESD protection.

SUMMARY

Aspects of the present disclosure in general relate to ESD protection in System on Chip employing non-planar technologies. In particular, they pertain to a semiconductor device—a Silicon Controlled Rectifier (SCR) to be specific—in non-planar technology to provide a robust ESD protection in System on Chip employing non-planar technologies.

In an aspect, the disclosed SCR overcomes problem of current crowding at the base emitter junction which limits efficient turn-on in conventional SCRs in non-planar technology, by providing an efficient forward bias current conduction path or trigger path independent of conventional base-emitter junction of parasitic BJT which helps in offering lower trigger and holding voltage, and therefore very high failure currents. In an aspect, the realized SCR has sub-3V trigger and holding voltage and thus can provide an efficient and robust ESD protection in SOCs. Beside low trigger and holding voltage, the proposed device offers three times better ESD robustness per unit area. Further the proposed SCR has no added capacitive loading and is compatible with standard process flow and design rules.

In an aspect, the disclosed semiconductor device can include (a) a fin shaped p-type tap and a fin shaped n-type cathode disposed over a p-type well in a substrate and isolated from each other by an intrinsic region between them; (b) a fin shaped n-type tap and a fin shaped p-type anode disposed over a n-type well in the substrate and isolated from each other; wherein the anode is isolated from the cathode by an intrinsic region between them; (c) one or more nanostructures of intrinsic semiconductor extending between any one or combination of the p-type tap to the cathode, the cathode to the anode, and the anode to the n-type tap. In an aspect, the one or more nanostructures provide a parallel trigger path to prevent problem of current crowding at base emitter junction.

In an aspect, tuning of gap between cathode and anode of the disclosed semiconductor device results in modification to holding voltage of the semiconductor device.

In an aspect, a gate stack (also referred to as first gate) is disposed over nanostructures between anode and cathode. In an alternate implementation, isolation between the anode and the cathode can be achieved by Shallow Trench Isolation (STI).

In an aspect, p-type tap and cathode are isolated by a STI, or by a gate (also referred to as second gate) disposed over the nanostructures between the isolated p-type tap and the cathode.

In an aspect, n-type tap and anode are also isolated by a STI, or by a gate (also referred to as third gate) disposed over the nanostructures between the n-type tap and the anode.

In an aspect, one or more nanostructures between different fin structures can be an array of nanowires and the nanowires can be stacked on top of each other with or without spacing between them. In an alternate embodiment, the one or more nanostructures between different fin structures can be fins.

In an aspect, substrate is a semiconductor or an insulator or a stack of a semiconductor and an insulator.

In an aspect, nanostructures can be made of any one or a combination of materials selected out of Si, SiGe, Ge, materials belonging to III-V or III-Nitride groups, transition metal dichalcogenides.

In an aspect, the disclosed device can further comprise guard-rings.

In an aspect, the present disclosure provides an ESD protection circuit for protection between PAD and ground in a System on Chip (SOC) using the disclosed SCR device. The ESD protection circuit for protection between PAD and ground in a SOC can comprise a first connection between n-type tap of the SCR device and power bus; a second connection between anode of the SCR device and PAD; and a third connection connecting p-tap and Cathode of the SCR device with ground. In an aspect, the SCR is triggered transiently by clamp between power bus and ground to protect the SOC.

In an aspect, the present disclosure also provides an ESD protection circuit for protection between power bus and ground in a System on Chip (SOC) using the disclosed SCR device, and the circuit can incorporate a connection between first gate over Anode and Cathode with an RC-MOS trigger circuit. The disclosed circuit can further include a connection each between the p-type tap and the Cathode of the SCR to the ground, from the anode of the SCR to the power bus and from the n-type tap of the SCR to the trigger circuit. The trigger circuit actuates the SCR to provide protection from Electrostatic Discharge between the power bus and the Ground.

Various objects, features, aspects and advantages of the inventive subject matter will become more apparent from the following detailed description of preferred embodiments, along with the accompanying drawing figures in which like numerals represent like components.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

FIG. 6A illustrates an exemplary 3-Dimensional schematic view of the proposed Nanowire SCR (NWSCR) in accordance with embodiments of the present disclosure.

FIGS. 6B and 6C illustrate exemplary cross-sectional views of the proposed Nanowire SCR (NWSCR) along transverse and longitudinal directions of fin structure in accordance with embodiments of the present disclosure.

FIG. 10A illustrates an exemplary isometric view of the proposed device with a configuration replacing nanowires by a Fin in accordance with an embodiment of the present disclosure.

FIGS. 10B and 10C illustrate exemplary cross-sectional views of the proposed fin structure replacing nanowires by a Fin along transverse and longitudinal directions of fin structure in accordance with embodiments of the present disclosure.

DETAILED DESCRIPTION

The following is a detailed description of embodiments of the disclosure depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within the spirit and scope of the present disclosure as defined by the appended claims.

Each of the appended claims defines a separate invention, which for infringement purposes is recognized as including equivalents to the various elements or limitations specified in the claims. Depending on the context, all references below to the "invention" may in some cases refer to certain specific embodiments only. In other cases it will be recognized that references to the "invention" will refer to subject matter recited in one or more, but not necessarily all, of the claims.

Various terms are used herein. To the extent a term used in a claim is not defined, it should be given the broadest definition persons in the pertinent art have given that term as reflected in printed publications and issued patents at the time of filing.

Aspects of the present disclosure in general relate to ESD protection in System on Chip employing non-planar technologies. In particular, they pertain to a semiconductor device—a Silicon Controlled Rectifier (SCR) to be specific—in non-planar technology to provide a robust ESD protection in System on Chip employing non-planar technologies.

SCR predominantly functions based on a regenerative mechanism between two opposite polarity bipolar transistors connected in a way that one bipolar triggers the other and vice versa. Therefore the effective triggering mechanism of an SCR is primarily correlated with the intrinsic gain and bipolar efficiency of individual bipolar transistors, which is largely affected by base—emitter junction field profile, majority carrier mobility in the base region, and minority carrier lifetime in the base region. These parameters are severely affected by current crowding and self-heating in the base region of the BJT.

Figure 1:
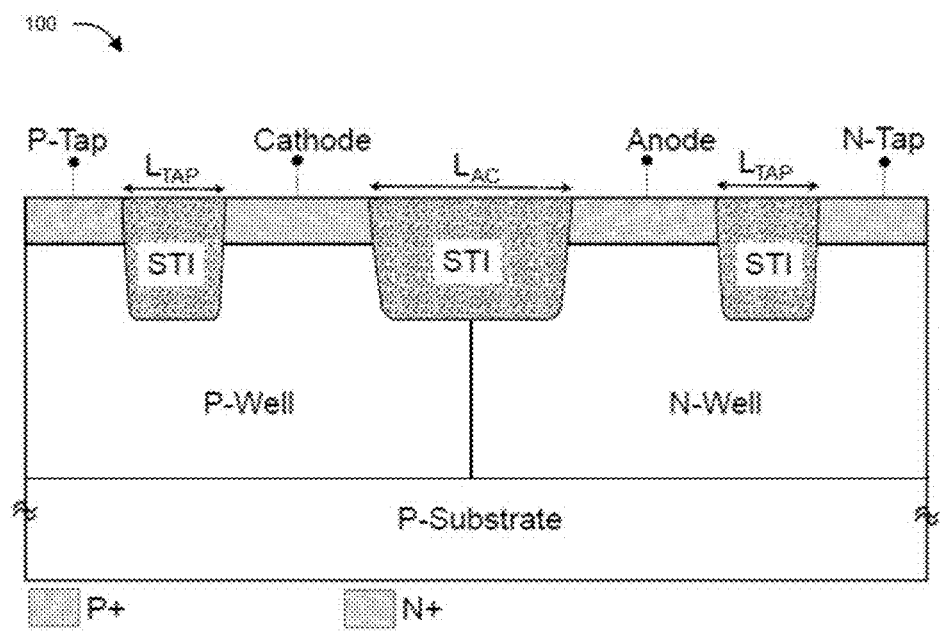
FIG. 1 illustrates a prior art planar SCR design.
Figure 2:
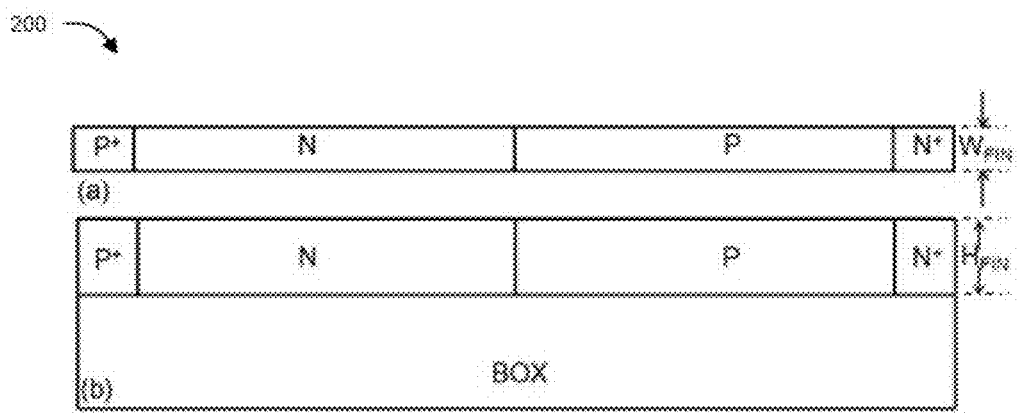
FIG. 2 shows top view and cross-sectional view of a conventional SCR device (P-N-P-N) in Silicon-in-Insulator (SOI) FinFET technology.
Figure 3:
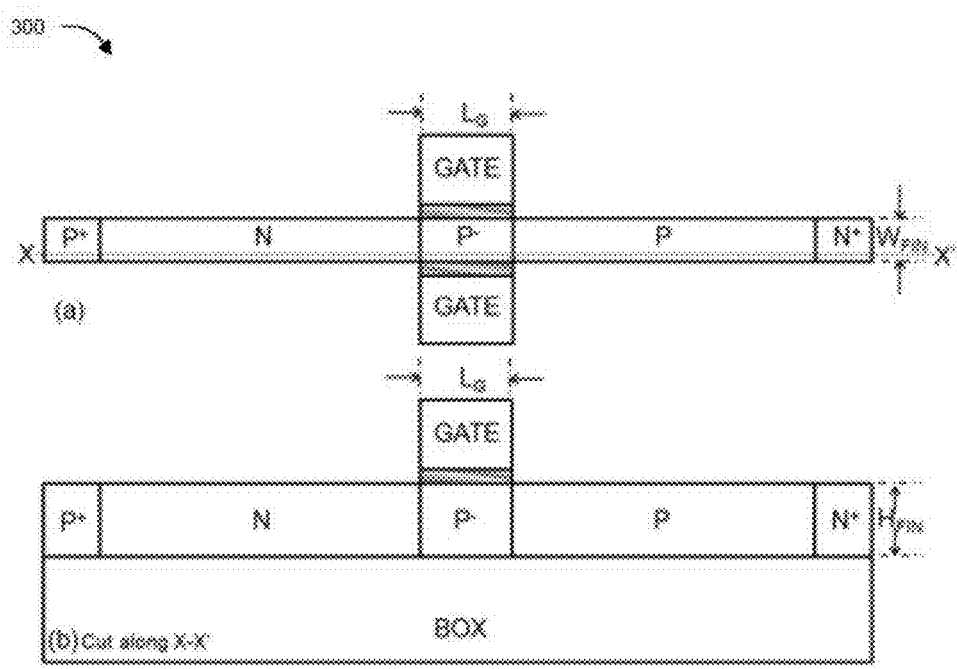
FIG. 3 shows top view and cross-sectional view of a conventional gated SCR device (P-N-P-N) in Silicon-in-Insulator (SOI) FinFET technology.
Figure 4:
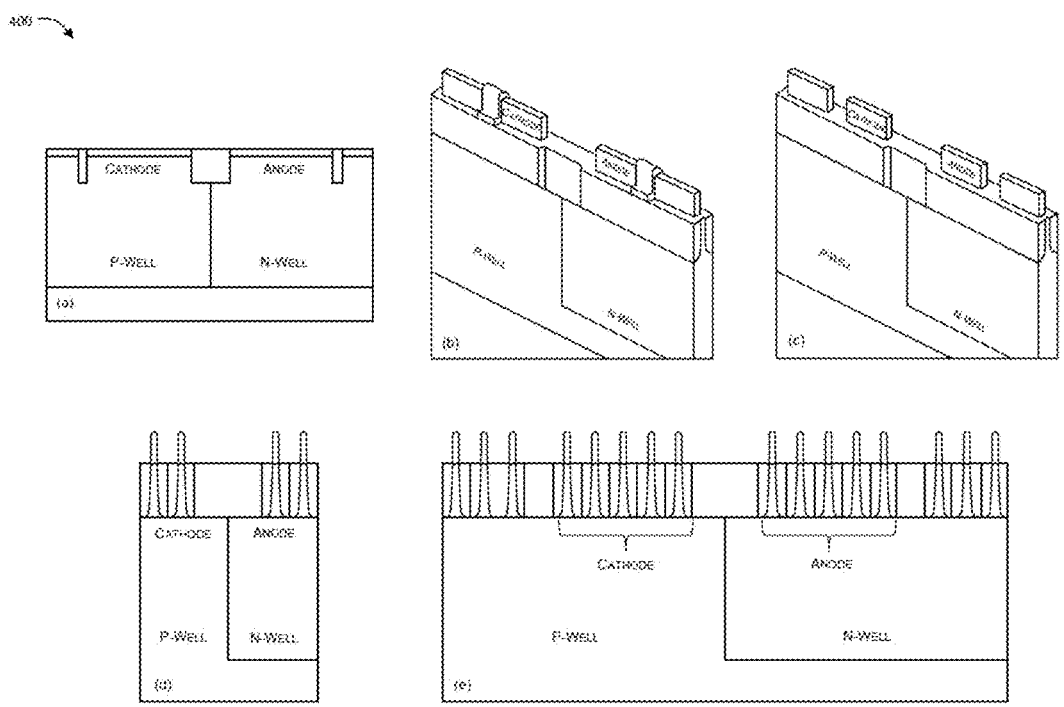
FIG. 4 shows different Fin or Nanowire SCR structures (b to e) based on their planar counterpart (a).

FIG. 4 shows a single fin SCR device evolved based on prior-art devices. It does not have flexibility to adjust the aspect ratio of base junction due to its invariable fin shape, and hence suffers from current crowding and self-heating in the base-emitter region, which significantly degrades BJT performance, and hence SCR performance.

Figure 5:
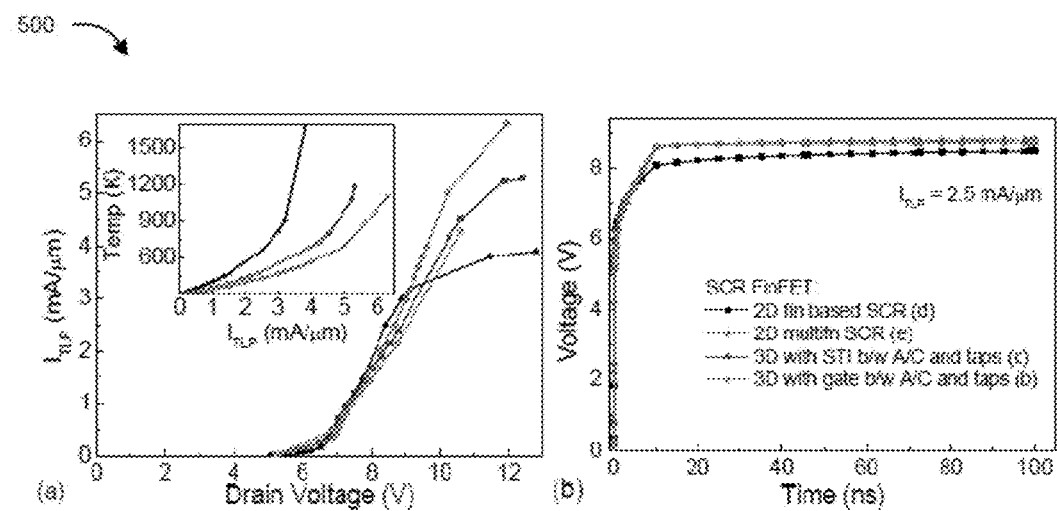
FIG. 5 shows simulated TLP characteristics and transient anode voltage vs. time characteristics of conventional bulk FinFET SCR designs as realized by simulation using 3D TCAD.

FIG. 5 shows simulated TLP characteristics using 3D TCAD of SCR device of FIG. 4. The characteristics show very high turn-on voltage and absence of snapback, which goes to show that the prior-art FinFET SCR designs have missing SCR action and hence cannot be adapted for the low voltage ESD protection concepts attributed to fundamental limitations of tunability within the ESD design window.

In an aspect, proposed SCR overcomes problem of current crowding at the base emitter junction which limits efficient turn-on in conventional SCRs in non-planar technology, by providing an efficient forward bias current conduction path or trigger path independent of conventional base-emitter junction of parasitic BJT which helps in offering lower trigger and holding voltage, and therefore very high failure currents. In an aspect, the realized SCR has sub-3V trigger and holding voltage and thus can provide an efficient and robust ESD protection in SOCs. Beside low trigger and holding voltage, the proposed device offers three times better ESD robustness per unit area. Further the proposed SCR has no added capacitive loading and is compatible with standard process flow and design rules.

FIGS. 6A, 6B and 6C illustrate an exemplary 3-Dimensional schematic view of the proposed Nanowire SCR (NWSCR) 600 and its cross-sectional views in accordance with embodiments of the present disclosure. As shown the disclosed SCR device can consist of parallel Nanowire 602 stacked over each other extending from a p-type tap (or p-trigger tap or p-tap) 604 to a n-type cathode 606, from the cathode 606 to p-type anode 608, and from the anode 608 to a n-type tap (or n-trigger tap or n-tap) 610. The stacked nanowires 602 may or may not have space between them.

In an aspect, p-type tap 604 can be isolated from cathode 606, the cathode 606 can be isolated from p-type anode 608, and the anode 608 can be isolated from n-type tap 610 by shallow trench isolation or by respective gates disposed over nanostructures disposed over them. Thus, the nanowires 602 extending between the p-type tap 604 and the cathode 606, the cathode 606 and the anode 608, and the anode 608 and the n-type tap 610 provide an efficient forward bias current conduction path or trigger current path that is unaffected by current crowding at base-emitter junctions of the semiconductor device thus overcoming problem of current crowding at the base emitter junction.

In an alternate embodiment, the nanowires extending from p-type tap 604 to cathode 606, from the cathode 606 to anode 608, and from the anode 608 to n-type tap 610 can be replaced by fins. FIGS. 10A, 10B and 10C illustrate exemplary 3-dimensional schematic and cross-sectional views of a configuration of the proposed semiconductor device 1000 where set of nanowires 602 have been replaced by a set of fins 1002 in accordance with an embodiment of the present disclosure.

In an exemplary aspect, three dimensional structure comprising p-tap 604, cathode 606, anode 608 and n-tap 610 with nanostructures between them can be extended/multiplied in X and/or Y directions i.e. planar direction of the device 600/1000 in order to increase current handling capability.

In an aspect, cathode 606, anode 608, p- and n-trigger taps 604/610 can be selectively doped. The n-tap 610 and anode 608 regions are connected with the n-Well 612, whereas p-tap 604 and cathode 606 are connected to the p-Well 614. In an alternate implementation, position of the n-tap 610 and p-tap 604 can be interchanged with positions of the anode 608 and the cathode 606 respectively. They can also be used as independent contacts to trigger one or the other parasitic bipolar. The key idea in SCR ESD protection device is to obtain a regenerative feedback between the base-collector junctions of the two back-to-back bipolar transistors, which enables the SCR 600/1000 to shunt ESD current.

In an aspect, there can be a gates disposed over the nanostructures 602 between the isolated p-type tap 604 and cathode 606, between n-type tap 610 and anode 608 and between the cathode 606 and the anode 608 (gate not shown in FIGS. 6A, 6B, and 10B but shown in FIGS. 6C, 10A and FIG. 10C showing section along longitudinal direction of fin structure). The gates can be used for isolation between respective structures as an alternative to STI.

In an aspect, substrate can be a semiconductor or an insulator or a stack of a semiconductor and an insulator.

In an aspect, nanowires 602 or fins 1000 extending from p-type tap 604 to cathode 606, from the cathode 606 to anode 608, and from the anode 608 to n-type tap 610 can be made of any one or a combination of materials selected out of Si, SiGe, Ge, materials belonging to III-V or III-Nitride groups, transition metal dichalcogenides.

In an aspect, the disclosed device can further comprise guard-rings.

Figure 7:
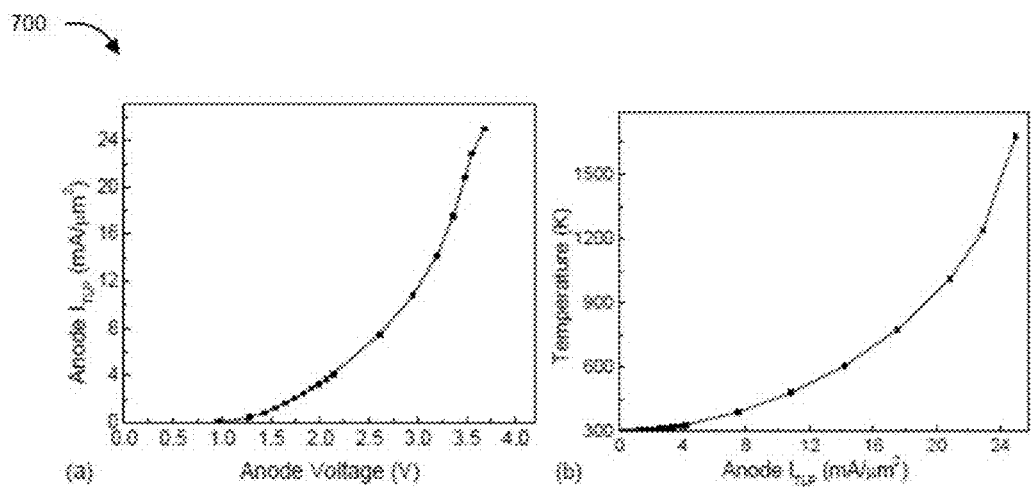
FIG. 7 illustrates an exemplary (a) TLP IV characteristics and (b) lattice temperature as a function of stress current across the proposed NWSCR in accordance with embodiments of the present disclosure.
Figure 11:
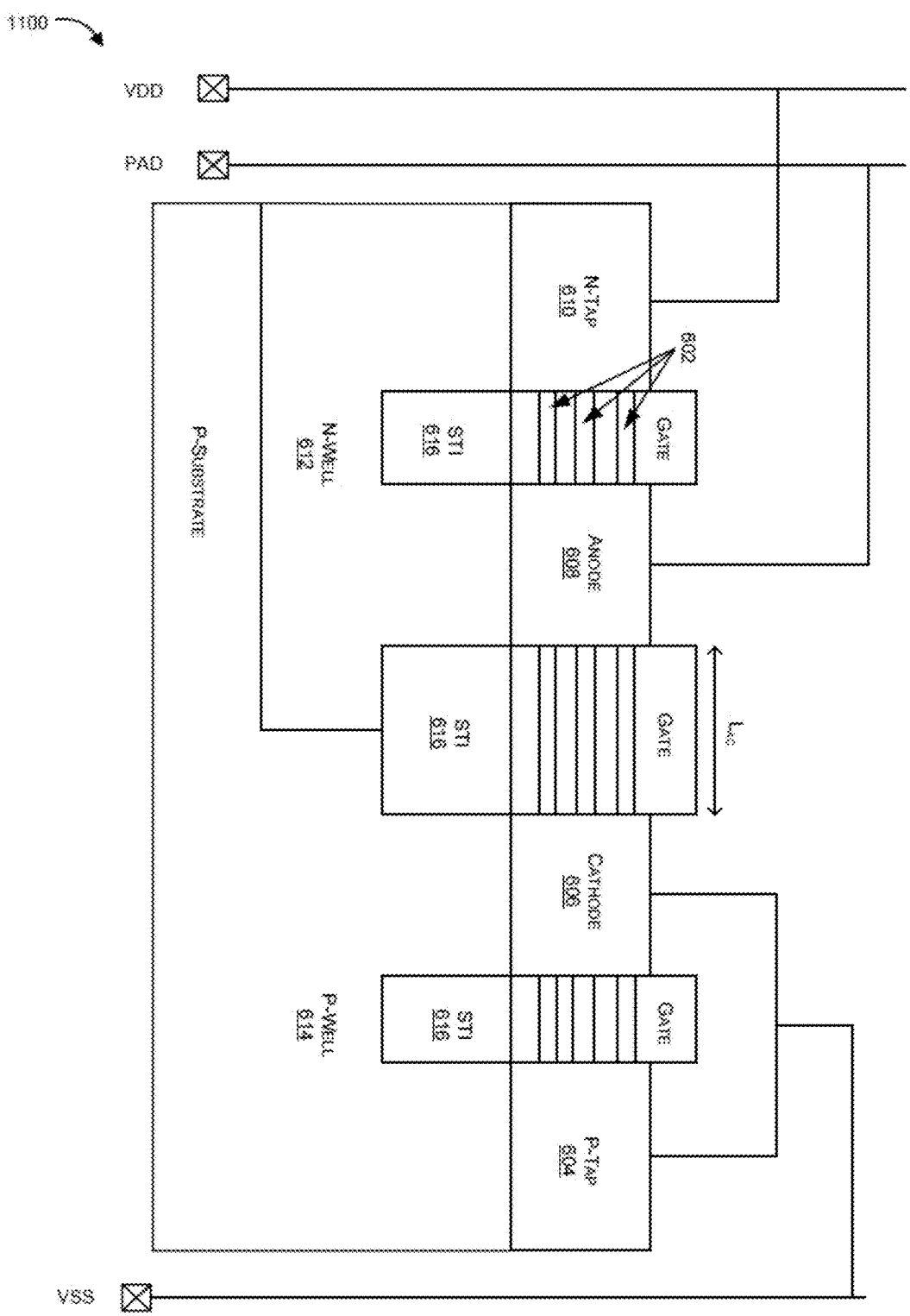
FIG. 11 illustrates an application of the proposed NWSCR device in transient triggered configuration as an ESD protection element between PAD and Ground in accordance with an embodiment of the present disclosure.
Figure 12:
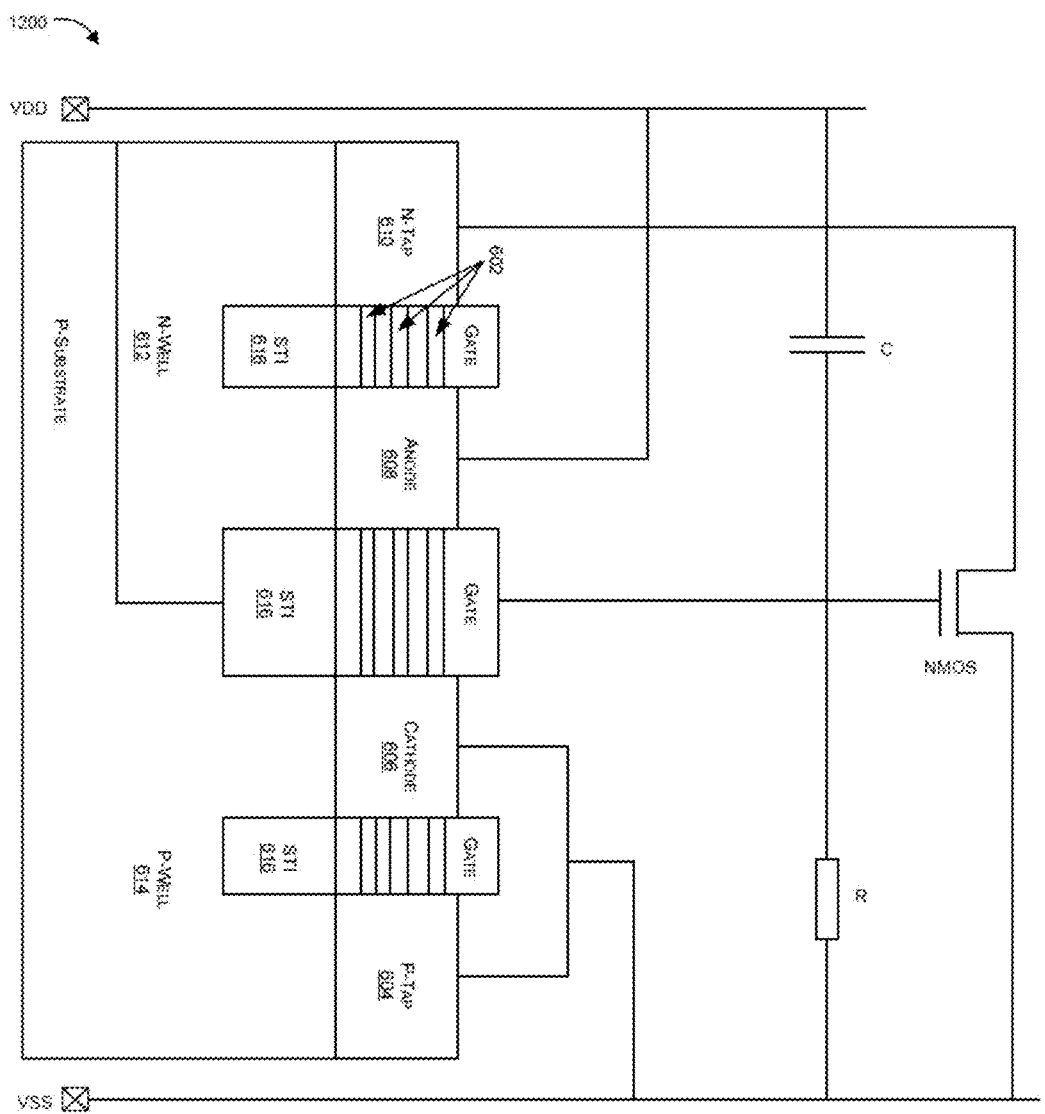
FIG. 12 illustrates another application of the proposed NWSCR device in RCMOS triggered configuration as an ESD protection element between power bus and Ground in accordance with an embodiment of the present disclosure.

In an embodiment of the disclosure, ESD behaviour of the proposed device was simulated using 3D device TCAD, in the configuration where, the anode 608 and n-tap 610 were stressed, and cathode 606 and p-tap 604 were grounded. TLP results presented in FIG. 7 show very low turn-on voltage and holding voltage. In addition to this, the proposed device offers a 3 times better ESD current handling capability per unit area as compared to its planar counterpart. Holding voltage of the proposed device can be further modified by tuning $L_{AC}$ (refer FIGS. 6 and 10) i.e. length of gap between the cathode 606 and the anode 608, and using trigger circuits as depicted in FIGS. 11 and 12. These design variations provide flexibility to tune the I-V characteristics of the ESD protection element, as per the chip operating requirements.

Figure 8:
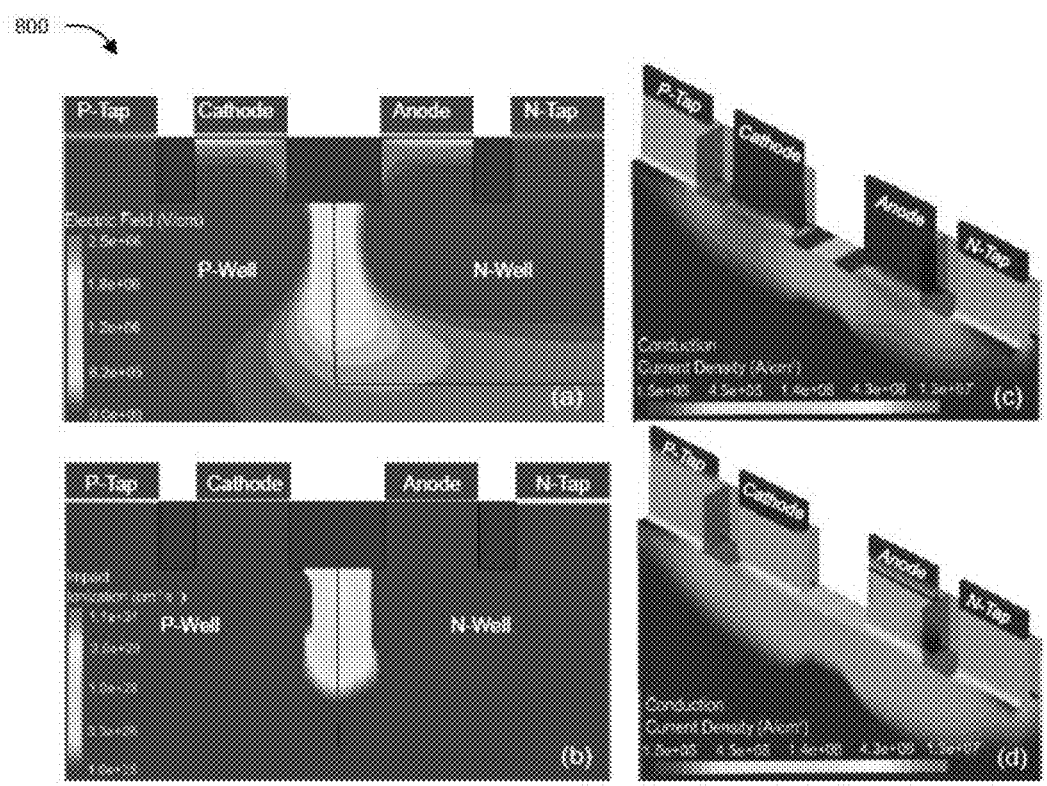
FIG. 8 illustrates (a) Electric Field, (b) Impact Ionization at the well junction, (c) conduction current distribution, and (d) flow of current through anode and cathode in the Conventional Fin SCR in accordance with embodiments of the present disclosure.

FIG. 8 illustrates operating principle of the proposed device. As in conventional SCRs, the well junction as shown in FIG. 8 a and b, undergoes avalanche breakdown. The generated electrons are collected by the n-tap, whereas excess holes are collected by the p-tap. As the holes migrate towards the p-tap, the base potential of the n-p-n transistor is increased, which forward biases the base-emitter junction (here the p-Well-Cathode junction; thereby turning on the n-p-n transistor), further leading to the electron emission from the emitter (Cathode) terminal. These electrons then decrease the n-Well potential, which forward biases the n-well-anode junction, and turns on the p-n-p transistor as evident from FIG. 8 c and d. This regenerative feedback mechanism allows efficient turn-on of the both the bipolar transistors, and results in low trigger and holding voltage as observed during simulation and shown in FIG. 7.

Figure 9:
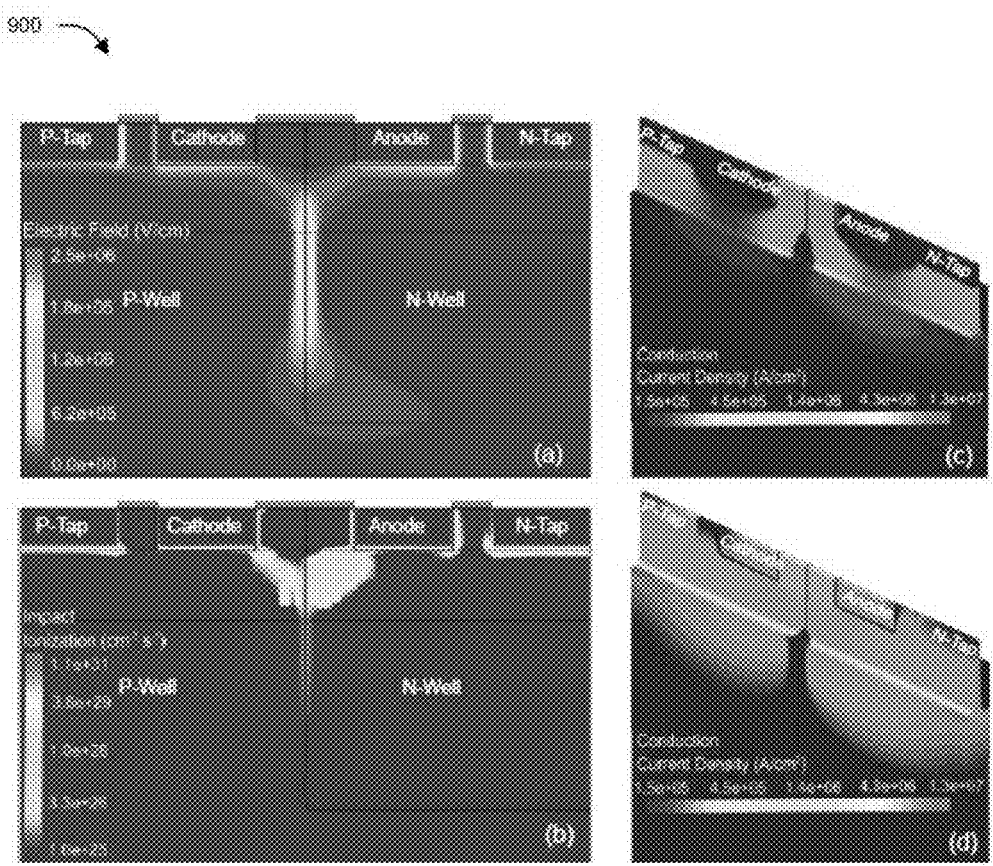
FIG. 9 illustrates contours depicting parallel trigger path through the Fin or Nanowire region in the proposed Nanowire SCR (NWSCR) in accordance with embodiments of the present disclosure.

Thus the disclosed SCR device overcomes limitation of current crowding at the base emitter junction affecting efficient turn-on of non-planar SCRs that are based on conventional concept. The proposed SCR design overcomes this limitation by providing an efficient forward bias current conduction path or the trigger path independent of conventional base-emitter junction of the parasitic BJT as is evident from FIG. 9 which shows contours depicting parallel trigger path through the Fin or Nanowire region. This also helps in offering lower trigger and holding voltage, and therefore very high failure currents.

The present disclosure further relates to an ESD protection mechanism/technique for protection between PAD and ground in a System on Chip (SOC) based on exemplary 3D semiconductor device configurations mentioned. As shown in FIG. 11, the protection circuit can incorporate a first connection between n-type tap 610 of the disclosed SCR device and power bus of SoC; a second connection between anode 608 of the SCR device and PAD of the SoC; and a third connection connecting p-tap 604 and Cathode 606 of the SCR device with ground. In an aspect, the SCR is triggered transiently by clamp between power bus and ground to protect the SOC from ESD.

In an aspect, the present disclosure also provides an ESD protection circuit for protection between power bus and ground in a System on Chip (SOC) using the disclosed SCR device. As shown in FIG. 12, the protection circuit can incorporate a connection between gate over nanostructures between Anode 608 and Cathode 606 of the SCR device with an RC-MOS trigger circuit. The disclosed circuit can further include a connection each between each of p-type tap 604 and Cathode 606 of the SCR to the ground, from the anode 608 of the SCR to the power bus and from the n-type tap 610 of the SCR to the trigger circuit. Gate between the anode and the cathode can be connected to RC-MOS trigger circuit or power bus. The trigger circuit actuates the SCR to provide protection from Electrostatic Discharge between the power bus and the Ground.

In an aspect, the proposed ESD protection circuit for protection between power bus and ground and between PAD and ground in a System on Chip (SOC) can be implemented on an integrated circuit that consists of one or more of the disclosed 3D semiconductor device.

While the foregoing describes various embodiments of the invention, other and further embodiments of the invention may be devised without departing from the basic scope thereof. The scope of the invention is determined by the claims that follow. The invention is not limited to the described embodiments, versions or examples, which are included to enable a person having ordinary skill in the art to make and use the invention when combined with information and knowledge available to the person having ordinary skill in the art.

Advantages of the Invention

The present disclosure provides a robust ESD protection in Metal-Oxide Semiconductor (MOS) devices in non-planar technologies.

The present disclosure provides ESD protection in low voltage-high speed I/O as well as for RF pads in System on Chip (SoC).

The present disclosure provides a Silicon Controlled Rectifier (SCR) in FinFET technology to meet ESD protection requirements in SoC employing non-planar technologies.

The present disclosure provides a SCR in non-planar technology that overcomes drawbacks of conventional SCRs.

The present disclosure provides a SCR in non-planar technology that provides control over its turn-on voltage and holding voltage.

The present disclosure provides a SCR in non-planar technology that incorporates feature of tunable trigger and holding voltage for exercising control over its turn-on voltage and holding voltage for an efficient and robust ESD protection.

The present disclosure provides a SCR design that provides low trigger and holding voltage for robust ESD protection.

The present disclosure provides a SCR design in non-planar technology that has low on-resistance.

The present disclosure provides a SCR design that provides better ESD robustness per unit area.

The present disclosure provides an ESD protection circuit in non-planar SOCs that employs a non-planar SCR and overcomes limitations of conventional schemes for ESD protection.

We claim:

1. A 3D semiconductor device comprising:
   a fin shaped p-type tap and a fin shaped n-type cathode disposed over a p-type well in a substrate, wherein the p-type tap and the cathode are isolated from each other by a first intrinsic region between them;
   a fin shaped n-type tap and a fin shaped p-type anode disposed over a n-type well in the substrate, wherein the n-type tap and the anode are isolated from each other by a second intrinsic region between them; wherein the anode is isolated from the cathode by a third intrinsic region between them;
   sets of one or more nanostructures of intrinsic semiconductor extending between any or a combination of the p-type tap to the cathode, the cathode to the anode, and the anode to the n-type tap.

2. The semiconductor device as claimed in claim 1, wherein the anode and the cathode are isolated by a shallow trench isolation, or through a gate stack disposed over the set of one or more nanostructures between the anode and the cathode.

3. The semiconductor device as claimed in claim 1, wherein the sets of one or more nanostructures of intrinsic semiconductor extending between any or a combination of the p-type tap to the cathode, the cathode to the anode, and the anode to the n-type tap provide an efficient forward bias current conduction path or trigger current path that is unaffected by current crowding at base-emitter junctions of the semiconductor device.

4. The semiconductor device as claimed in claim 1, wherein tuning of gap between the cathode and the anode results in modification to holding voltage of the semiconductor device.

5. The semiconductor device as claimed in claim 1, wherein one or more nanostructures in the sets of one or more nanostructures are made of an array of nanowires.

6. The semiconductor device as claimed in claim 5, wherein nanowires in the array of nanowires are stacked on top of each other with or without spacing between them.

7. The semiconductor device as claimed in claim 1, wherein the one or more nanostructures in the sets of one or more nanostructures is a fin.

8. The semiconductor device as claimed in claim 1, wherein the substrate is a semiconductor or an insulator or a stack of a semiconductor and an insulator.

9. The semiconductor device as claimed in claim 1, wherein nanostructures in the sets of one or more nanostructures are made of any one or a combination of materials selected out of Si, SiGe, Ge, materials belonging to III-V or III-Nitride groups, transition metal dichalcogenides.

10. The semiconductor device as claimed in claim 1, wherein the device further comprises guard-rings.

11. The semiconductor device as claimed in claim 1, wherein the p-type tap and the cathode are isolated by a shallow trench isolation, or by through a gate disposed over the set of one or more nanostructures between the p-type tap and the cathode.

12. The semiconductor device as claimed in claim 1, wherein the n-type tap and the anode are isolated by a shallow trench isolation, or by through a gate disposed over the set of one or more nanostructures between the isolated n-type tap and the anode.

13. A System on Chip incorporating at least one SCR, the at least one SCR comprising:
a fin shaped p-type tap and a fin shaped n-type cathode disposed over a p-type well in a substrate and isolated from each other;
a fin shaped n-type tap and a fin shaped p-type anode disposed over a n-type well in the substrate and isolated from each other; wherein the anode is isolated from the cathode;
sets of one or more nanostructures of intrinsic semiconductor extending from the p-type tap to the cathode, from the cathode to the anode and from the anode to the n-type tap;
a gate stack disposed over the set of one or more nanostructures between the anode and the cathode.

14. The System on Chip as claimed in claim 13, wherein the System on Chip incorporates ESD protection circuit to provide protection from Electrostatic Discharge between PAD and Ground, the protection circuit comprising:
a first set of the at least one SCR;
a set of at least one first connection between the n-type tap of the first set of the at least one SCR and power bus of the System on Chip:
a set of at least one second connection between the anode of the first set of the at least one SCR and PAD of the System on Chip;
a set of at least one third connection from the p-type tap and the Cathode of the first set of the at least one SCR to the ground;
wherein the at least one SCR belonging to the first set of at least one SCR is triggered transiently by clamp between the power bus and the Ground to provide protection from Electrostatic Discharge between the PAD and the Ground.

15. The System on Chip as claimed in claim 14, wherein the protection circuit further incorporates ESD protection circuit to provide protection from Electrostatic Discharge between the power bus and the Ground, the protection circuit comprising:
a second set of the at least one SCR;
a set of at least one fourth connection between the gate between anode and cathode of the second set of the at least one SCR and a trigger circuit;
a set of at least one fifth connection from the p-type tap and the Cathode of the second set of the at least one SCR to the ground of the System on Chip;
a set of at least one sixth connection from the anode of the second set of the at least one SCR to a power bus of the System on Chip;
a set of at least one seventh connection from the n-type tap of the second set of the at least one SCR to the trigger circuit;
wherein the trigger circuit actuates the second set of at least one SCR to provide protection from Electrostatic Discharge between the power bus and the Ground.

16. The System on Chip as claimed in claim 15, wherein the trigger circuit comprises a RCMOS.

17. The System on Chip as claimed in claim 15, wherein the ESD protection circuits to provide protection from Electrostatic Discharge between PAD and Ground and between the power bus and the Ground are implemented through one or more integrated circuits incorporating the at least one SCR.

* * * * *